United States Patent
Shim et al.

(10) Patent No.: US 9,484,069 B2
(45) Date of Patent: Nov. 1, 2016

(54) AUXILIARY POWER SUPPLY DEVICES AND NONVOLATILE MEMORY SYSTEMS INCLUDING THE SAME

(71) Applicant: Samsung Electronics Co., Ltd., Suwon-si, Gyeonggi-do (KR)

(72) Inventors: In Bo Shim, Osan-si (KR); Jongjoo Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/611,763

(22) Filed: Feb. 2, 2015

(65) Prior Publication Data
US 2015/0357005 A1 Dec. 10, 2015

(30) Foreign Application Priority Data
Jun. 9, 2014 (KR) ........................ 10-2014-0069368

(51) Int. Cl.
G11C 5/14 (2006.01)
G06F 3/06 (2006.01)
G11C 16/30 (2006.01)

(52) U.S. Cl.
CPC ............. G11C 5/141 (2013.01); G06F 3/0625 (2013.01); G06F 3/0653 (2013.01); G06F 3/0679 (2013.01); G11C 16/30 (2013.01); Y10T 307/615 (2015.04)

(58) Field of Classification Search
CPC . G11C 5/141; Y10T 307/615; G06F 3/0679; G06F 3/0653; G06F 3/0625
See application file for complete search history.

(56) References Cited

U.S. PATENT DOCUMENTS

| | | | |
|---|---|---|---|
| 5,587,648 A * | 12/1996 | Jinbo | G11C 5/147 323/269 |
| 6,591,212 B2 | 7/2003 | Kim | |
| 6,812,586 B2 | 11/2004 | Wacknov et al. | |
| 7,203,547 B1 | 4/2007 | Kroll et al. | |
| 7,474,879 B2 | 1/2009 | Turner et al. | |
| 7,786,701 B2 | 8/2010 | Altemose | |
| 8,058,844 B2 | 11/2011 | Altemose | |
| 2006/0133181 A1* | 6/2006 | Amano | G11C 5/141 365/229 |
| 2006/0277422 A1* | 12/2006 | Berke | G11C 5/141 713/300 |
| 2008/0048613 A1 | 2/2008 | Baron et al. | |
| 2010/0146333 A1* | 6/2010 | Yong | G06F 1/305 714/14 |
| 2013/0155800 A1* | 6/2013 | Shim | G11C 5/04 365/229 |
| 2013/0254464 A1 | 9/2013 | Kimura et al. | |

FOREIGN PATENT DOCUMENTS

KR   1020100034291 A   4/2010

* cited by examiner

*Primary Examiner* — Khamdan Alrobaie
(74) *Attorney, Agent, or Firm* — Myers Bigel & Sibley

(57) ABSTRACT

An auxiliary power supply device can include a first power storage unit, a first charging circuit to receive input power and charge the first power storage unit, a second power storage unit having lower power supply speed than the first power storage unit and longer power supply time than the first power storage unit, a second charge circuit to receive input power and charge the second power storage unit, and a switching unit to supply the stored power of the first power storage unit to external devices for a predetermined time when a sudden power-off occurs and supply stored power of the second power storage unit to the external devices after the predetermined time elapses.

19 Claims, 10 Drawing Sheets

AUXILIARY POWER SUPPLY DEVICES AND NONVOLATILE MEMORY SYSTEMS INCLUDING THE SAME

CROSS-REFERENCE TO RELATED APPLICATIONS

This U.S. non-provisional patent application claims priority under 35 USC §119 to Korean Patent Application No. 10-2014-0069368, filed on Jun. 9, 2014, the disclosure of which is incorporated by reference in its entirety herein.

BACKGROUND

The present inventive concepts described herein relate to power supplies of semiconductor memories and more particularly, to auxiliary power supply devices and nonvolatile memory systems including the same.

Semiconductor memory devices are memory devices implemented using a semiconductor such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Nonvolatile memory devices may include a static RAM (SRAM), a dynamic RAM (DRAM), and a synchronous DRAM (SDRAM). Nonvolatile memory devices are memory devices that retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (ReRAM), and a ferroelectric RAM (FRAM).

Since nonvolatile memory devices retain their stored data even when their power supplies are interrupted, nonvolatile memory devices may be used as a mass storage medium. In general, a nonvolatile memory system including nonvolatile memory devices and a memory controller controlling the nonvolatile memory devices operates with externally received power. Power may be suddenly shut off while the nonvolatile memory system operates, which is called sudden power-off. At this point, data stored in the nonvolatile memory device is not lost. However, since the memory controller may also store important data using a volatile memory such as SRAM or DRAM, data stored in the memory controller may be lost or may not complete an operation that the nonvolatile memory device is performing (e.g., an erase operation, a write operation, etc.).

In order to address the above disadvantages, the nonvolatile memory system can perform a sudden power-off operation using an auxiliary power supply to complete the operation that is being performed and to back up the important data immediately after the sudden power-off occurs, the peak power required to complete the operation that is being performed can increase. During the subsequent data backup operation, a long-term supply of power at a lower peak power may be required instead. The auxiliary power supply may include a plurality of capacitors or a high-capacity battery to meet both a requirement for high peak power immediately after the sudden power-off occurs as well as a requirement for a low peak current for a long time. However, the area occupied by such an auxiliary power supply may increase due to the capacitor or the high-capacity battery.

SUMMARY OF THE INVENTION

Embodiments of the present inventive concepts can provide auxiliary power supply devices and nonvolatile memory systems including the same.

Further embodiments of the present inventive concepts provide nonvolatile memory systems. The memory systems can comprise a nonvolatile memory device; a memory controller configured to control the nonvolatile memory device; and an auxiliary power supply device configured to receive an input power and supply an output power to the nonvolatile memory device and to the memory controller and including first and second power storage units. The auxiliary power supply device can be configured to detect a sudden power-off, to initially supply stored power of the first power storage unit to the nonvolatile memory device and the memory controller as the output power when the sudden power-off is detected, and to subsequently supply stored power of the second power storage unit to the nonvolatile memory device and the memory controller as the output power after supplying the stored power of the first power storage unit.

In some embodiments of the present inventive concepts, the first power storage unit can supply a larger power supply amount per unit time than a second power storage unit, and the second power storage unit can be configured to supply stored power for a longer time than the first power storage unit.

In some embodiments of the present inventive concepts, nonvolatile memory devices and the memory controllers can be configured to use stored power provided by the auxiliary power supply device to perform a first sudden power-off operation and a second sudden power-off operation when the sudden power-off occurs.

In some embodiments of the present inventive concepts, a first sudden power-off operation can include an operation to complete a transaction that the nonvolatile memory device was performing prior to the sudden power-off which can be performed while the stored power of the first power storage unit is supplied.

In some embodiments of the present inventive concepts, the second sudden power-off operation may include a backup operation of the memory controller which can be performed after the first sudden power-off operation is completed.

In some embodiments of the present inventive concepts, a first peak power required during the first sudden power-off operation can be higher than a second peak power required during the second sudden power-off operation.

In some embodiments of the present inventive concepts, a first operation time of the first sudden power-off operation can be shorter than a second operation time of the second sudden power-off operation.

In some embodiments of the present inventive concepts, auxiliary power supply devices can comprise a first charging circuit configured to receive the input power and charge the first power storage unit to a first charge voltage; and a second charging circuit configured to receive the input power and charge the second power storage unit to a second charge voltage.

In some embodiments of the present inventive concepts, the switching unit can be configured to supply the stored power of the first power storage unit to the nonvolatile memory device and the memory controller as the output power for a predetermined time when the sudden power-off occurs and to supply the stored power of the second power storage unit to the nonvolatile memory device and the memory controller as the output power after the predetermined time elapses.

In some embodiments of the present inventive concepts, the switching unit can be configured to compare the first and second charge voltages with each other and can supply the stored power of the first power storage unit or the stored power of the second power storage unit to the memory controller and the nonvolatile memory device based on a result of the comparison.

In some embodiments of the present inventive concepts, the first power storage unit can include a tantalum capacitor and the second power storage unit can include a battery.

Embodiments of the present inventive concepts provide auxiliary power supply devices which can comprise a first power storage unit; a first charging circuit configured to receive an input power and charge the first power storage unit; a second power storage unit configured to supply a smaller power supply amount per unit time than the first power storage unit configured to supply power for a longer time than the first power storage unit; a second charging circuit configured to receive the input power and charge the second power storage unit; and a switching unit configured to switch between supplying stored power of the first power storage unit to a plurality of devices and supplying stored power of the second power storage unit to the plurality of devices after a sudden power-off occurs.

In some embodiments of the present inventive concepts, the switching unit can be configured to switch between supplying the stored power of the first power storage unit to the plurality of devices for a predetermined time when the sudden power-off occurs and supplying the stored power of the second power storage unit to the plurality of devices after the predetermined time elapses.

In some embodiments of the present inventive concepts, the first charging circuit can be configured to charge the first power storage unit to a first charge voltage and the second charging circuit can be configured to charge the second power storage unit to a second charge voltage lower than the first charge voltage.

In some embodiments of the present inventive concepts, the switching unit can be configured to compare a first charge voltage of the first power storage unit with a second charge voltage of the second power storage unit when the sudden power off occurs, to supply the stored power of the first power storage unit to the plurality of devices when the first charge voltage of the first power storage unit is higher than the second charge voltage of the second power storage unit, and to supply the stored power of the second power storage unit to the plurality of devices when the first charge voltage of the first power storage unit is lower than the second charge voltage of the second power storage unit.

In some embodiments of the present inventive concepts, the switching unit can be configured to detect the sudden power-off based on a voltage of the input power.

In some embodiments of the present inventive concepts, the switching unit can be configured to receive an external trigger signal and detect the sudden power-off based on the received external trigger signal.

In some embodiments of the present inventive concepts, the switching unit can be configured to supply the stored power of the first power storage unit to the plurality of devices when the sudden power-off is detected and a voltage level of the input power is higher than a predetermined voltage level and to supply the stored power of the second power storage unit to the plurality of devices when the voltage level of the input power is lower than the predetermined voltage level.

In some embodiments of the present inventive concepts, the predetermined voltage level can be a level of a minimum voltage required for performing a first sudden power-off operation.

Further embodiments of the present inventive concepts provide solid state drives. The solid state drives can comprise a plurality of nonvolatile memory devices; a buffer memory; a solid state drive controller; and an auxiliary power supply device configured to receive an input power and supply an output power to the plurality of nonvolatile memory devices, the buffer memory and the solid state drive controller. The auxiliary power supply device can comprise a first power storage unit and a second power storage unit, and can be configured to detect a sudden power-off, to initially supply stored power of the first power storage unit to the plurality of nonvolatile memory devices, the buffer memory, and the solid state drive controller as the output power when the sudden power-off is detected, and to subsequently supply stored power of the second power storage unit to the plurality of nonvolatile memory devices, the buffer memory, and the solid state drive controller as the output power after supplying the first stored power.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure, in the drawings.

DETAILED DESCRIPTION

Figure 1:
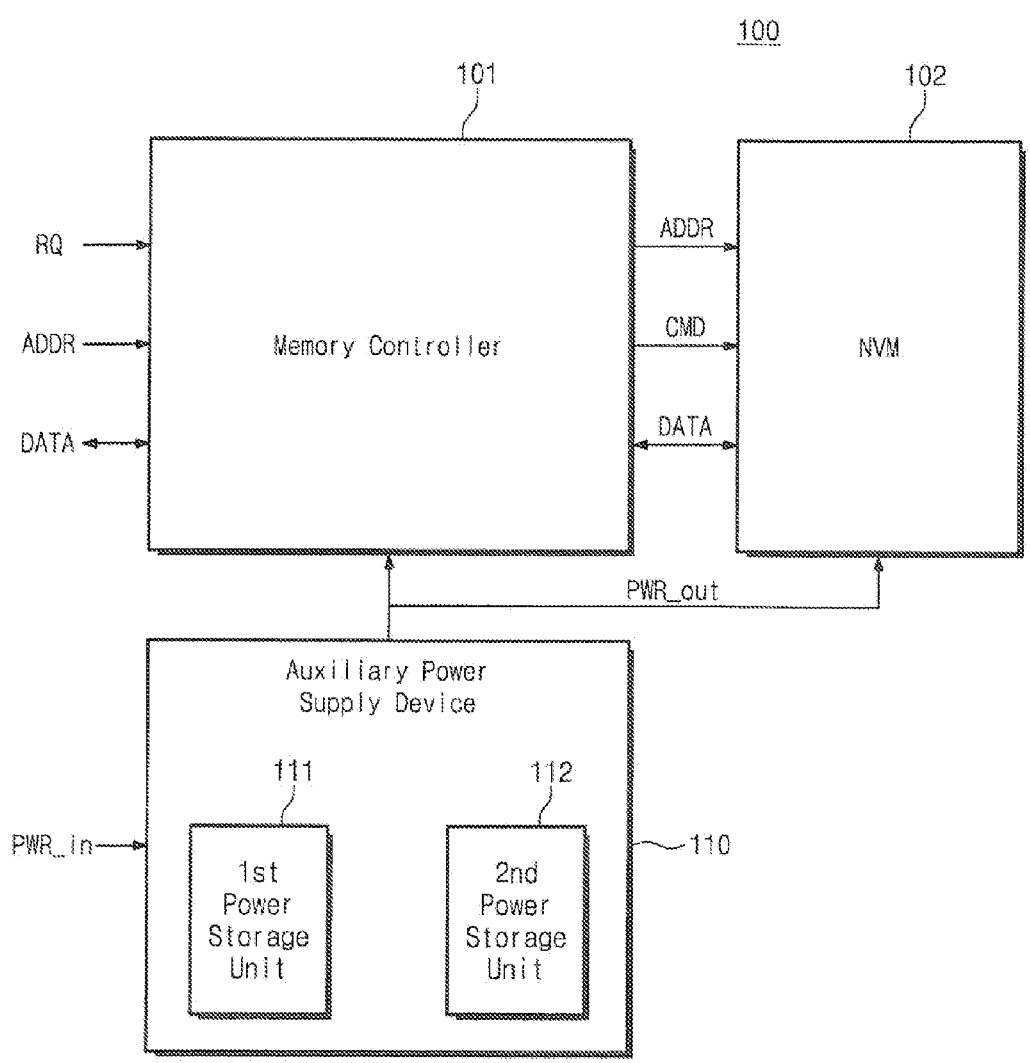
FIG. 1 is a block diagram of nonvolatile memory systems according to embodiments of the present inventive concepts.

The present inventive concepts now will be described more fully hereinafter with reference to the accompanying drawings. However, specific structural and functional details disclosed herein are merely representative for purposes of describing example embodiments of the present inventive concepts. Example embodiments of the present inventive concepts may be embodied in many alternate forms and should not be construed as limited to only the embodiments set forth herein. Rather, these embodiments are provided so that this disclosure will be thorough and complete, and will fully convey the scope of the present inventive concepts to those skilled in the art.

Accordingly, while example embodiments of the present inventive concepts are capable of various modifications and alternative forms, embodiments thereof are shown by way of example in the drawings and will herein be described in detail. It should be understood, however, that there is no intent to limit example embodiments of the present inventive concepts to the particular forms disclosed, but to the contrary, example embodiments of the inventive concepts are to cover all modifications, equivalents, and alternatives falling within the scope of example embodiments of the present inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the present inventive concepts. As used herein, the singular forms "a", an and the are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of nonvolatile memory systems according to embodiments of the present inventive concepts.

Referring to FIG. 1, the nonvolatile memory system 100 may include a memory controller 101, a nonvolatile memory device 102, and an auxiliary power supply device 110. The memory controller 101 may receive signals such as a request RQ and an address ADDR from an external device (e.g., host, application processor, etc.). The memory controller 101 may exchange data DATA with the external device.

The memory controller 101 may control the nonvolatile memory device 102 in response to the signals received from the external device. For example, the memory controller 101 may transmit signals such as an address ADDR and a command CMD to the nonvolatile memory device 102 to write data into the nonvolatile memory device 102 or the memory controller 101 may read data written into the nonvolatile memory device 102 in response to the received signals.

The nonvolatile memory device 102 may receive write data DATA from the memory controller 101 or transmit stored data DATA to the memory controller 101 in response to the received signals. In some embodiments, the nonvolatile memory device 102 may include nonvolatile memory elements such as a NAND flash memory, a NOR flash memory, an MRAM, a ReRAM, a PRAM, and a FRAM.

The auxiliary power supply device 110 may receive input power PWR_in from an external device (e.g., host, application processor, etc.) or a separate power device. The auxiliary power supply device 110 may output the received input power PWR_in as output power PWR_out. In some embodiments, the output power PWR_out may be supplied to the memory controller 101 and the nonvolatile memory device 102, and the memory controller 101 and the nonvolatile memory device 102 may operate based on the output power PWR_out.

In some embodiments, the auxiliary power supply device 110 may supply the auxiliary power to the nonvolatile memory system 100 when a sudden power-off occurs. For example, the auxiliary power supply device 110 includes first and second power storage units 111 and 112. The first and second power storage units 111 and 112 may be charged through the input power PWR_in. When a sudden power-off occurs, the first and second power storage units 111 and 112 may supply the output power PWR_out to the memory controller 101 and the nonvolatile memory device 102 by using stored power.

In some embodiments, the first and second power storage units 111 and 112 may include different charging elements, respectively. For example, the first power storage unit 111 may include a tantalum capacitor, and the second power storage unit 112 may include a battery. In general, the power supply speed of the tantalum capacitor is faster than that of the battery. Thus, the power supply speed of the first power storage unit 111 may be faster than that of the second power storage unit 112. In other words, the first power storage unit 111 may supply high peak power within a shorter time than that of the second power storage unit 112, in some embodiments, power supply speed may indicate the amount of power supplied per unit time.

In general, a battery may supply power for a longer time than a tantalum capacitor having the same area. That is, the second power storage unit 112 may supply power for a longer time than the first power storage unit 111.

In some embodiments, the supply of the input power PWR_in may be suddenly shut off, i.e., a sudden power-off (SPO) may occur. When the sudden power-off occurs, the nonvolatile memory system 100 may complete an operation that is being performed and may back up important data (e.g., mapping table, meta data, etc.) stored in the memory controller 101 to the nonvolatile memory device 102.

The above operation is called a "sudden power-off operation". Hereinafter, for brevity of description, it will be assumed that the sudden power-off operation may be divided into first and second sudden power-off operations. The first sudden power-off operation may include the completion of an operation that the nonvolatile memory device 102 was performing prior to the sudden power-off. This first sudden power-off operation may continue for a predetermined time immediately after the sudden power-off (e.g., a write operation, an erase operation or the like). The second sudden power-off operation may include the back-up of important data by the memory controller 101 after completing the operation that is being performed. However, the scope of the present inventive concepts is not limited thereto, and the first and second sudden power-off operations may be modified as needed and may further include other sudden power-off operations.

In some embodiments, the nonvolatile memory system 100 may perform the second sudden power-off operation after completing the first sudden power-off operation. In some embodiments, peak power required during the first sudden power-off operation may be higher than that required during the second sudden power-off operation. In some embodiments, the first sudden power-off operation time may be shorter in duration than the second sudden power-off operation time. That is, high peak power may be required in the first sudden power-off operation for a relatively short time, and low peak power may be required in the second sudden power-off operation for a relatively long time.

As described above, the peak power required in the nonvolatile memory system 100 may increase for a predetermined time from a time point when the sudden power-off occurs (i.e., during the first sudden power-off operation). At this point, the auxiliary power supply device 110 may supply the output power PWR_out to the memory controller 101 and the nonvolatile memory device 102 by using the first power storage unit 111 for a predetermined time from the time point when the sudden power-off occurs (i.e., while the first sudden power-off operation is performed).

After completing the first sudden power-off operation, the nonvolatile memory system 100 may perform a second sudden power-off operation such as data backup. At this point, the peak power required in the nonvolatile memory system 100 may be lower than that required during the first sudden power-off operation. The auxiliary power supply device 110 may supply the output power PWR_out to the memory controller 101 and the nonvolatile memory device 102 by using the second power storage unit 112 during the second sudden power-off operation.

As described above, the auxiliary power supply device 110 may supply the output power PWR_out by using the first and second power storage units 111 and 112 (in other words, different types of power storage units) during the sudden power-off. Since a conventional power supply circuit uses a single power storage unit (e.g., super capacitor, super capacitor array, etc.), it is difficult to reduce an area of a power storage unit to provide both a high peak power and a long power supply time. However, the auxiliary power supply device 110 according to the present inventive concepts has a reduced area by using the first power storage unit 111 supplying high peak power and the second power storage unit 112 having long power supply time and a reduced area.

Figure 2:
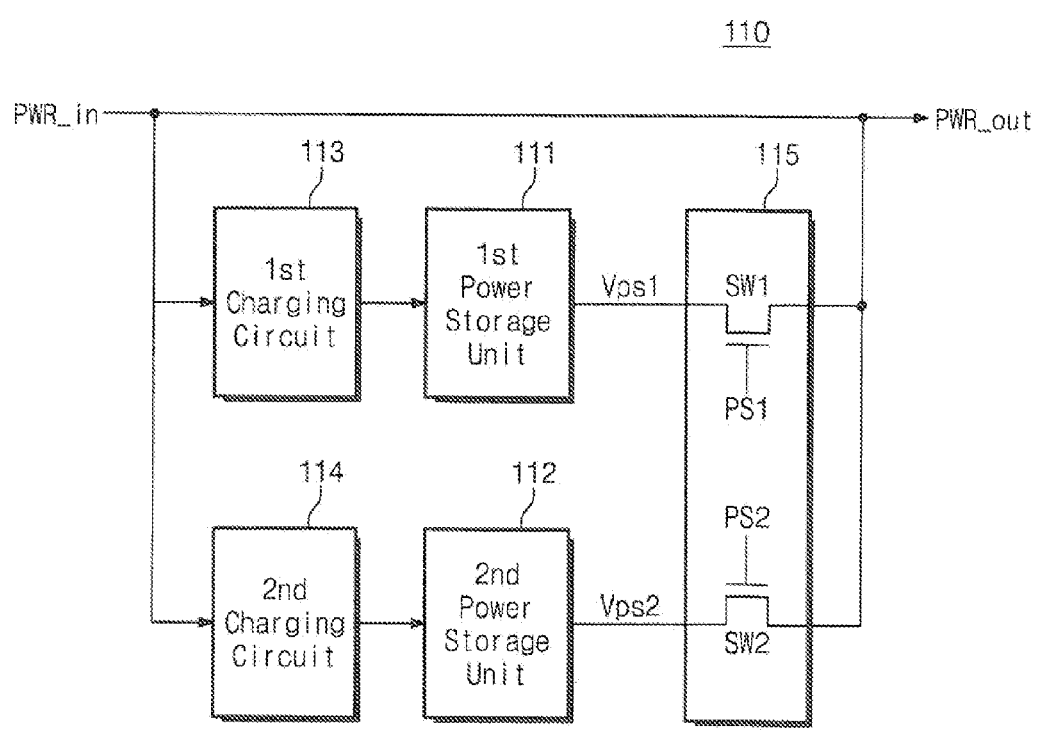
FIG. 2 is a block diagram of the auxiliary power supply devices in FIG. 1.

FIG. 2 is a block diagram of the auxiliary power supply device 110 in FIG. 1. Referring to FIGS. 1 and 2, the auxiliary power supply device 110 may include first and second power storage units 111 and 112, first and second charging circuits 113 and 114, and a switching unit 115.

The first charging circuit 113 may be configured to receive input power PWR_in and may charge the first power storage unit 111. For example, the first charging circuit 113 may charge the first power storage unit 111 above a first predetermined voltage level. The second charging circuit 114 may be configured to receive the input power PWR_in and may charge the second power storage unit 112. For example, the second charging circuit 114 may charge the second power storage unit 112 above a second predetermined voltage level. In some embodiments, a charging voltage of the first power storage unit 111 may be higher than that of the second power storage unit 112.

The switching unit 115 may detect a sudden power-off and begin to output the power stored in the first power storage unit 111 or the second power storage unit 112 as output power PWR_out. For example, the switching unit 115 may monitor a voltage change of the input power PWR_in to detect a sudden power-off situation. When the sudden power-off occurs, a voltage of the input power PWR_in may rapidly decrease. That is, when the voltage of the input power PWR_in decreases rapidly, the switching unit 115 may detect the sudden power-off situation. Alternatively, the switching unit 115 may externally receive a sudden power-off trigger signal and detect the sudden power-off based on the received signal.

When a sudden power-off occurs, the nonvolatile memory system 100 may require a greater peak power to perform a first sudden power-off operation. In this case, the switching unit 115 may set a first switching signal PS1 to logic high to output charged power stored in the first power storage unit 111 as output power PWR_out for a predetermined time from a time point when the sudden power-off occurs. That is, the power stored in the first power storage unit 111 with a high power supply speed may be supplied to the memory controller 101 and the nonvolatile memory device 102 for a predetermined time to supply the power used in a sudden power-off operation of the memory controller 101 and the nonvolatile memory device 102.

After the predetermined time elapses from the time point when the sudden power-off occurs, the switching unit 115 may set a second switching signal PS2 to logic high to output the power stored in the second power storage unit 112 as output power PWR_out.

In some embodiments, the auxiliary power supply device 110 may further include components such as a voltage regulator to stabilize a voltage output from the first and second power storage units 111 and 112 and a one-directional element (e.g., diode, etc.) to prevent reversal of power.

As described above, for a predetermined time from a time point when a sudden power-off occurs, the peak power required in the memory controller 101 and the nonvolatile memory device 102 may increase to complete an operation that is being performed. At this point, the auxiliary power supply device 110 may output stored power of the first power storage unit 111 with a high power supply speed as the output power PWR_out to satisfy the peak power required in the memory controller 101 and the nonvolatile memory device 102 to perform a first sudden power-off operation. Then the auxiliary power supply device 110 may output the stored power stored in the second power storage unit 112, which is capable of supplying power with a low output for a long time, as the output power PWR_out to complete a second sudden power-off operation such as the backup of important data.

Figure 3:
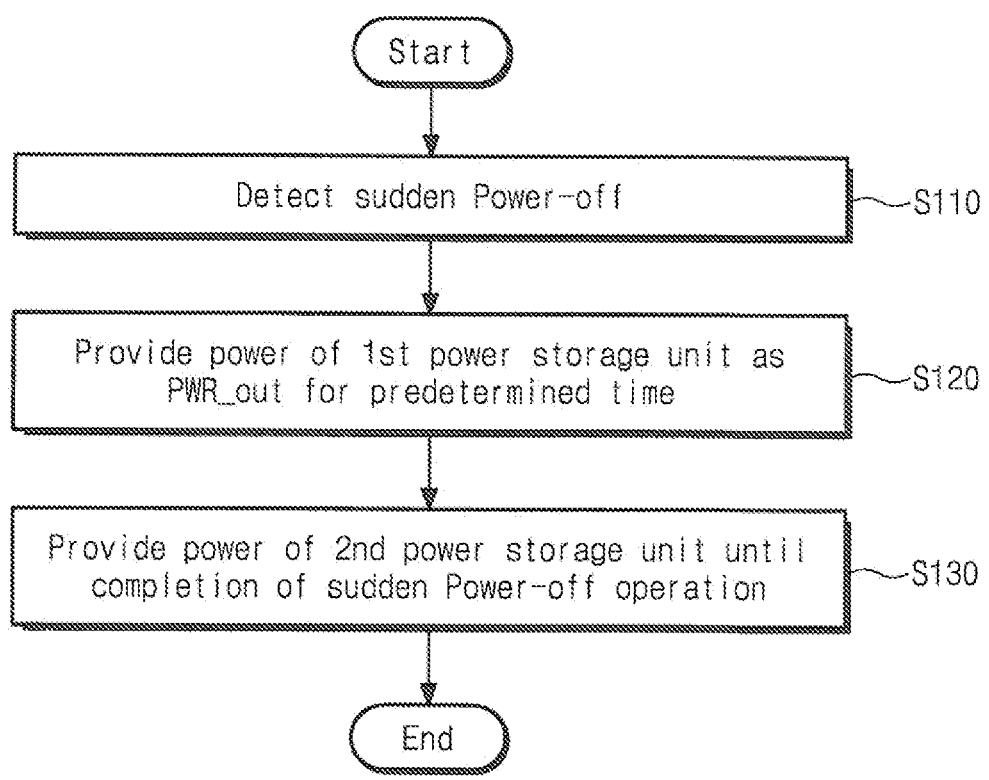
FIG. 3 is a flowchart summarizing the operation of the auxiliary power supply devices in FIG. 2.
Figure 4:
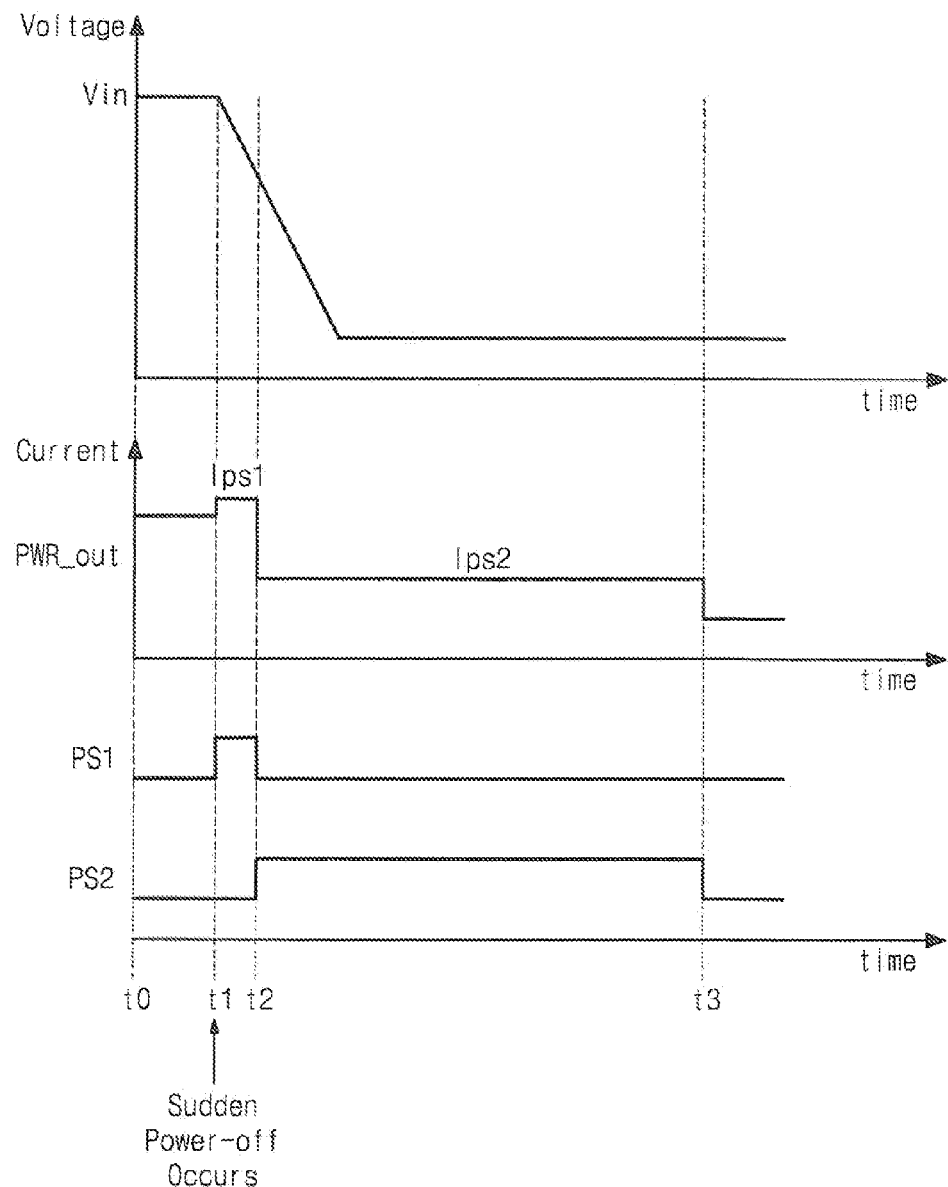
FIG. 4 is a graph to explain the flowchart FIG. 3.

FIG. 3 is a flowchart summarizing the operation of the auxiliary power supply devices in FIG. 2, and FIG. 4 is a graph to explain the flowchart in FIG. 3. In FIG. 4, the x-axis represents time and the three areas of the y-axis denote a voltage or a voltage level, a current or a current level, and a signal level, respectively.

Referring to FIGS. 2 and 3, in an operation S110, the auxiliary power supply device 110 may detect a sudden power-off. In some embodiments, the auxiliary power supply device 110 may monitor a voltage Vin of the input power PWR_in to detect a sudden power-off. Alternatively, the auxiliary power supply device 110 may receive a sudden power-off trigger signal from an external device (e.g., the memory controller 101, a host, an application processor, etc.) and detect a sudden power-off based on the received signal.

For example input power PWR_in may be supplied to the nonvolatile memory system 100 for a time point t0 to a time point it, where t1 occurs after to, as shown in FIG. 4. A sudden power-off may occur at the time point t1 in this case, the voltage Vin of the input power PWR_in may rapidly decrease for a predetermined time from the time point t1. The auxiliary power supply device 110 may monitor a voltage of the input power PWR_in or receive an external sudden power-off trigger signal to detect a sudden power-off that occurs at the time point t1.

In an operation S120, the auxiliary power supply device 110 may supply the stored power of the power storage unit 111 for a predetermined time. For example, the auxiliary power supply device 110 may supply the stored power of the first power storage unit 111 to the memory controller 101 and the nonvolatile memory device 102 as the output power PWR_out immediately after the sudden power-off occurs. In some embodiments, the predetermined time may be the time required to complete an operation that the nonvolatile memory device 102 is performing. That is, the predetermined time is the time required to perform a first sudden power-off operation.

For example, as shown in FIG. 4, when a sudden power-off occurs at the time point t1, the auxiliary power supply device 110 may enable a first switch signal PS1 (e.g., set the first switch signal PS1 to logic high) from the time point t1 to a time point t2, where t2 is later than t1 (i.e., for a predetermined time). In response to the enabled first switch signal PS1, the charging power of the first power storage unit 111 may be supplied to the memory controller 101 and the nonvolatile memory device 102 as the output power PWR_out.

In some embodiments, the nonvolatile memory system 100 may perform the first sudden power-off operation from the time point t1 to the time point t2. As shown in FIG. 4, the amount of current Ips1 of the output power PWR_out output from the time point t1 to the time point t2 may be greater than the amount of current Ips2 of the output power PWR_out output during the second sudden power-off operation.

In an operation S130, after the predetermined time elapses the auxiliary power supply device 110 may supply the stored power of the second power storage unit 112 until the sudden power-off operation is completed. For example, the auxiliary power supply device 110 may supply the stored power of the second power storage unit 112 to the memory controller 101 and the nonvolatile memory device 102 as the output power PWR_out until the sudden power-off operation is completed after the predetermined time elapses. In some embodiments, the nonvolatile memory system 100 may perform a second sudden power-off operation at S130.

For example, the first sudden power-off operation of the nonvolatile memory system 100 may be completed at the time point t2, as shown in FIG. 4. The auxiliary power supply device 110 may enable the second switching signal PS2 (or set the second switching signal PS2 to logic high) from the time point t2 to a time point t3, where t3 is later than t2, to supply the stored power of the second power storage unit 112 to the memory controller 101 and the nonvolatile memory device 102. In some embodiments, the time point t3 may indicate a time point when the sudden power-off operation of the nonvolatile memory system 100 is completed.

In some embodiments, although voltage, current or signal levels are shown in form of pulses for brevity in FIG. 4, it will be understood that the scope of the present inventive concepts is not limited thereto and waveforms of the voltage, current or signal levels may be modified in various forms.

According to the above-described embodiments of the present inventive concepts, the auxiliary power supply device 110 can supply the stored power of the first power storage unit 111 to the memory controller 101 and the nonvolatile memory device 102 for a predetermined time from a time point when a sudden power-off occurs. Since the first power storage unit 111 has a high power supply speed, the power required during the first sudden power-off operation of the nonvolatile memory system 100 may be satisfied.

After the predetermined time elapses, the auxiliary power supply device 110 can supply the stored power of the second power storage unit 112 to the memory controller 101 and the nonvolatile memory device 102. Since the second power storage unit 112 may supply a relatively low peak power for a relatively long time, the power required during the second sudden power-off operation of the nonvolatile memory system 100 may be satisfied.

Figure 5:
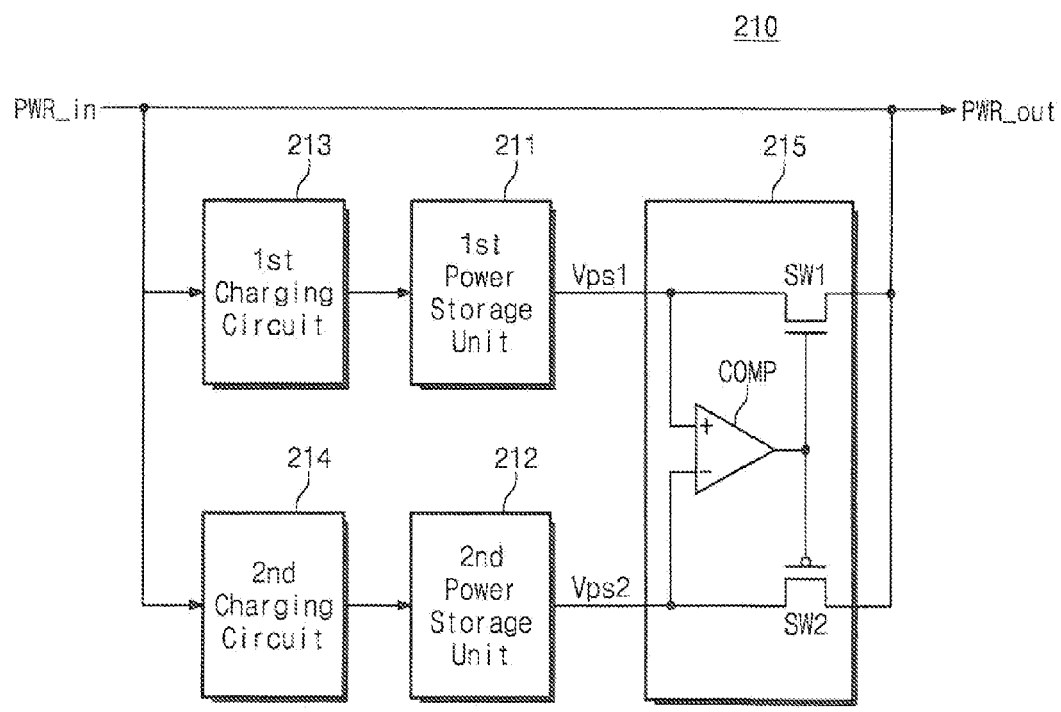
FIG. 5 is a block diagram of auxiliary power supply devices according to embodiments of the present inventive concepts.

FIG. 5 is a block diagram of auxiliary power supply devices 210 according to embodiments of the present inventive concepts. As illustrated, the auxiliary power supply device 210 may include first and second power storage units 211 and 212, first and second charging circuits 213 and 214, and a switching unit 215. The first and second power storage units 211 and 212 and the first and second charging circuits 213 and 214 have been described with reference to elements 111, 112, 113, and 114 in FIG. 2, respectively, and will not be described in further detail.

The switching unit 215 may include first and second switching elements SW1 and SW2 and a comparator COMP. Unlike the switching unit 115 shown in FIG. 1, the switching unit 215 shown in FIG. 5 may compare a first charge voltage Vps1 output from the first power storage unit 211 with a second charge voltage Vps2 output from the second power storage unit 212 and may output the stored power of the first power storage unit 211 or the second power storage unit 212 as output power PWR_out based on a result of the comparison.

The first power storage unit 211 may be charged with the first charge voltage Vps1 by the first charging circuit 213. The second power storage unit 212 may be charged with the second charge voltage Vps2 by the second charging circuit 214. In this case, the first charge voltage Vps1 may be higher than the second charge voltage Vps2. The comparator COMP may compare the first and second charge voltages Vps1 and Vps2 with each other and drive the first and second switching elements SW1 and SW2 based on a result of the comparison. For example, the first charge voltage Vps1 may be higher than the second charge voltage Vps2 immediately after a sudden power off occurs. The switching unit 215 may output the stored power from the first power storage unit 211 having a higher charge voltage as the output power PWR_out.

As the power stored in the first power storage unit 211 is output, the first charge voltage Vps1 may slowly decrease. After a predetermined time elapses (i.e., the first sudden power-off operation is completed), the charge voltage Vps1 of the first power storage unit 211 may be made lower than the charge voltage Vps2 of the second power storage unit 212. In this case, the switching unit 215 may output the stored power of the second power storage unit 212 instead of the first power storage unit 211 as the output power PWR_out.

That is, the auxiliary power supply device 210 may output the stored power of the first power storage unit 211 when a sudden power-off occurs and outputs the stored power of the second power storage unit 212 when the charge voltage Vps1 of the first power storage unit 211 is made lower than the charge voltage Vps2 of the second power storage unit 212. Thus, both the high peak power required in the first sudden power-off operation and the power supplied for a long time required during the second sudden power-off operation may be satisfied.

Figure 6:
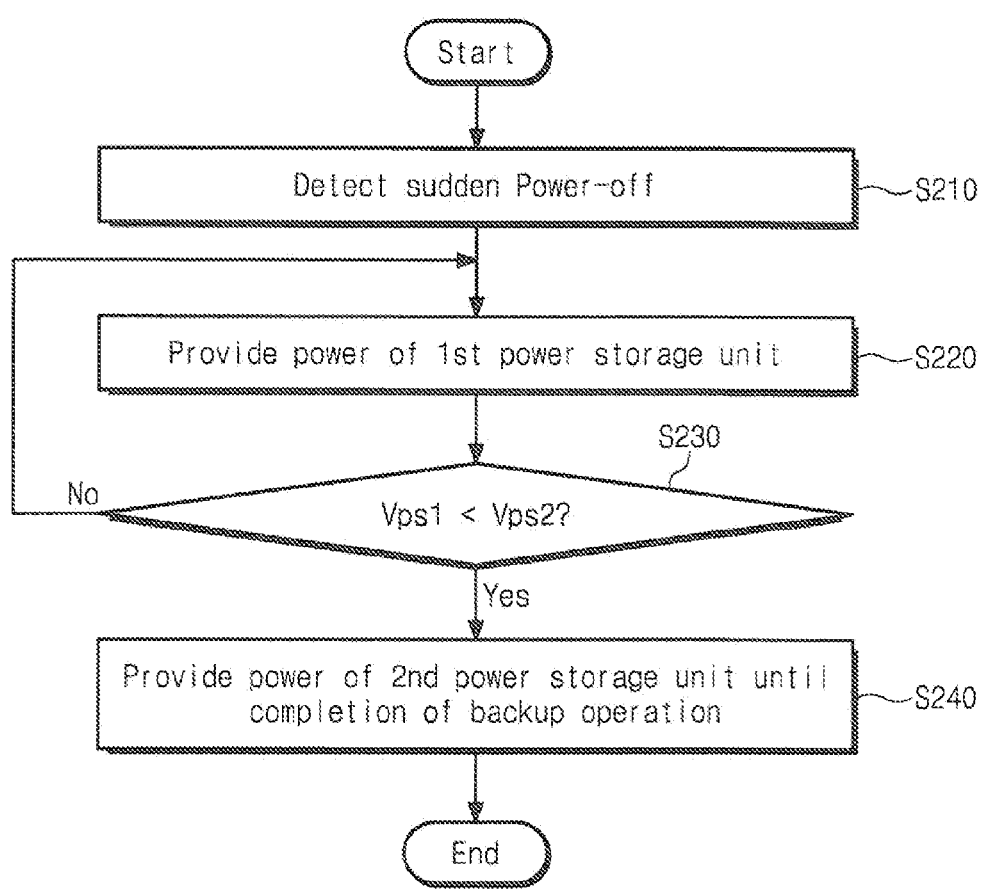
FIG. 6 is a flowchart summarizing the operation of the auxiliary power supply devices in FIG. 5.

FIG. 6 is a flowchart illustrating the operation of the auxiliary power supply device 210 in FIG. 5. Referring to FIGS. 5 and 6, in an operation S210, the auxiliary power supply device 210 may detect a sudden power-off. In some embodiments, the auxiliary power supply device 210 may detect a sudden power-off based on the methods described with reference to the operation of S110 in FIG. 3.

In an operation S220, the auxiliary power supply device 210 may output the stored power of the first power storage unit 211 as the output power PWR_out.

In an operation S230, the auxiliary power supply device 210 may compare the charge voltage Vps1 of the first power storage unit 211 with the charge voltage Vps2 of the second power storage unit 212.

When the first charge voltage Vps1 is higher than the second charge voltage Vps2, the auxiliary power supply device 210 may continue to output the stored power of the first power storage unit 211 as the output power PWR_out.

When the first charge voltage Vps1 is lower than the second charge voltage Vps2, in an operation S240, the auxiliary power supply device 210 may output the stored power of the second power storage unit 212 as the output power PWR_out until the sudden power-off operation is completed.

In some embodiments, the operations of S220 to S240 may be repeated. That is, the stored power of the first power storage unit 211 may be output when the first charge voltage Vps1 is higher than the second charge voltage Vps2 and the stored power of the second power storage unit 212 may be output when the first charge voltage Vps1 is lower than the second charge voltage Vps2.

According to the above-described embodiment of the present inventive concepts, the auxiliary power supply device 210 may output the stored power of the first power storage unit 211 with a high power supply speed as the output power PWR_out when a sudden power-off occurs. Then the auxiliary power supply device 210 may output the stored power of the second power storage unit 212 as the output power PWR_out when the charge voltage Vps1 of the first power storage unit 211 is made lower than the charge voltage Vps2 of the second power storage unit 212.

Thus, both a high peak power required in a first sudden power-off operation performed immediately after a sudden power-off occurs and a long-term power supply required in a second sudden power-off operation performed after the first sudden power-off operation is performed may be satisfied, and an auxiliary power supply device with a reduced area may be provided.

Figure 7:
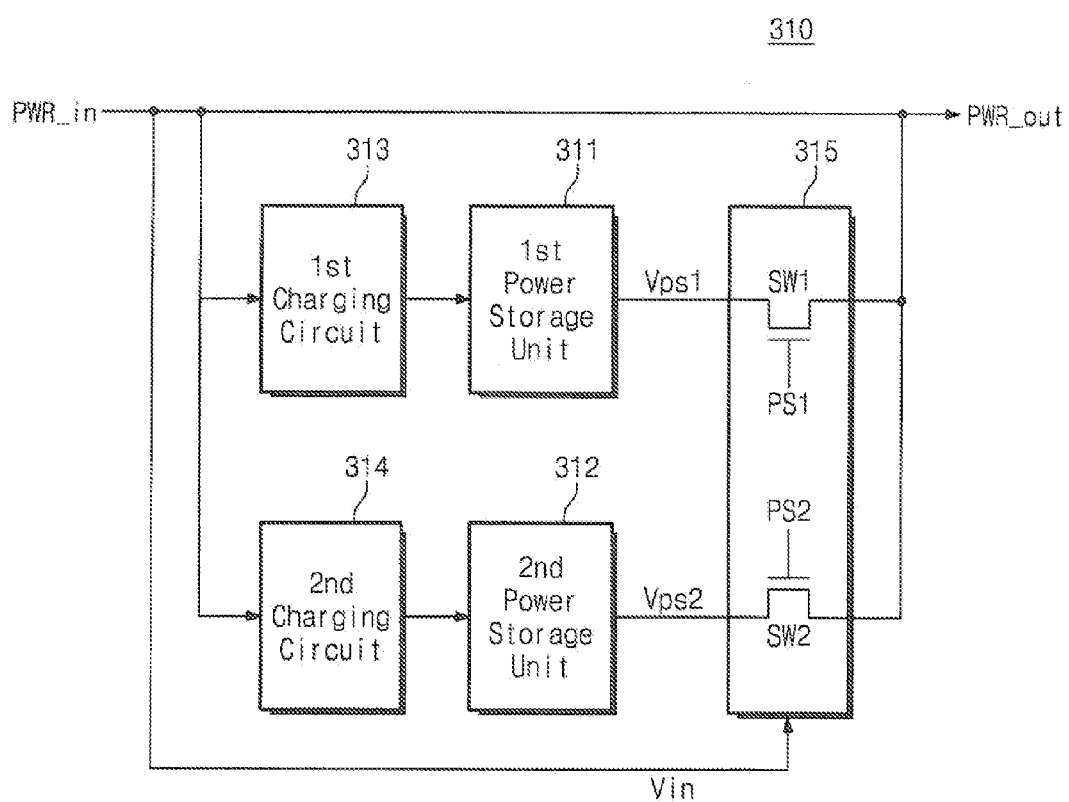
FIG. 7 is a block diagram of auxiliary power supply devices according to embodiments of the present inventive concepts.

FIG. 7 is a block diagram of an auxiliary power supply device 310 according to embodiments of the present inventive concepts. As illustrated, the auxiliary power supply device 310 includes first and second power storage units 311 and 312, first and second charging circuits 313 and 314, and a switching unit 315. The first and second power storage units 311 and 312 and the first and second charging circuits 313 and 314 have been described with reference to elements 111, 112, 113, and 114 in FIG. 2, respectively, and will not be described in further detail.

Unlike the auxiliary power supply device 110 in FIG. 2 and the auxiliary power supply device 210 in FIG. 5, the auxiliary power supply device 310 in FIG. 7 may output the stored power of the first power storage unit 311 or the second power storage 312 as the output power PWR_out based upon a comparison of a voltage Vin of the input power PWR_in.

For example, when a sudden power-off occurs, a voltage Vin of the input power PWR_in may rapidly decrease. The switching unit 315 may compare the voltage Vin of the input power PWR_in with a predetermined reference voltage value Vref. When the voltage Vin of the input power PWR_in is higher than the predetermined reference voltage value Vref, the switching unit 315 may enable a first switching signal PS1 to output the stored power of the first power storage unit 311 as the output power PWR_out. When the voltage Vin of the input power PWR_in is lower than the predetermined reference voltage value Vref, the switching unit 315 may enable a second switching signal PS2 to output the stored power of the second power storage unit 312 as the output power PWR_out.

In some embodiments, the predetermined reference voltage value Vref may indicate a level of a minimum voltage required by a nonvolatile memory system to perform a first sudden power-off operation.

Figure 8:
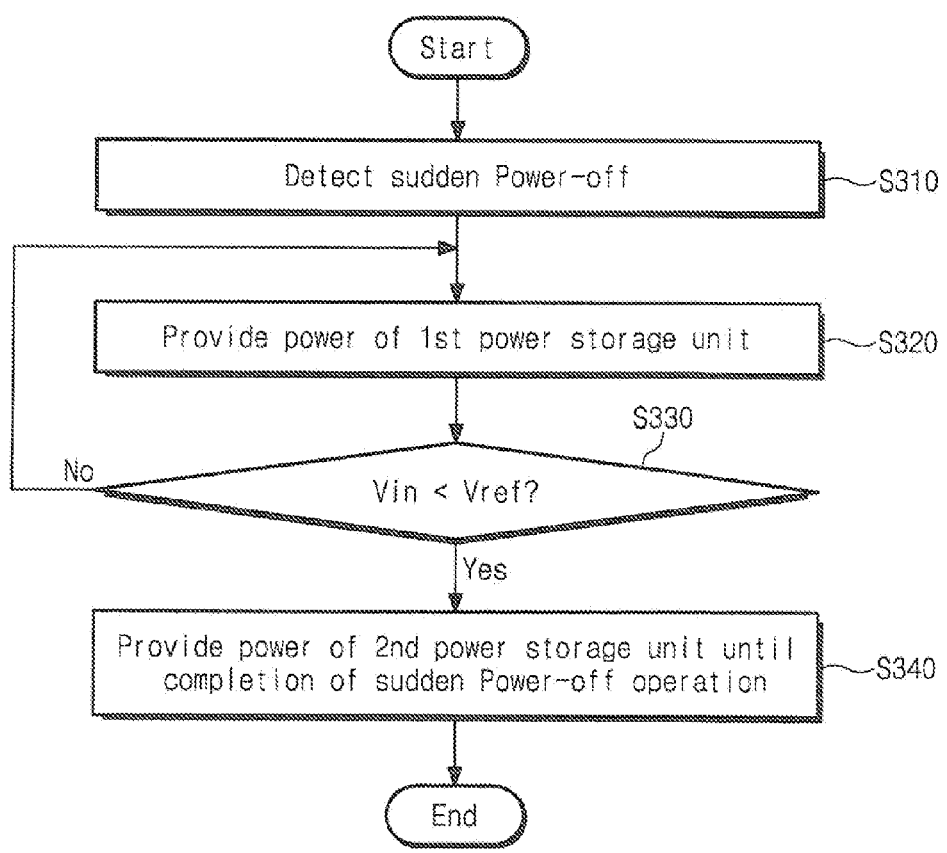
FIG. 8 is a flowchart summarizing the operation of the auxiliary power supply devices in FIG. 7.

FIG. 8 is a flowchart summarizing the operation of the auxiliary power supply device 310 in FIG. 7. Referring to FIGS. 7 and 8, in an operation S310, the auxiliary power supply device 310 may detect a sudden power-off. For example, the auxiliary power supply device 310 may a detect sudden power-off based on the methods with reference to S110 in FIG. 3.

In an operation S320, the auxiliary power supply device 310 may output the stored power of the first power storage unit 311 as the output power PWR_out.

In an operation S330, the auxiliary power supply device 310 may compare a voltage Vin of the input power PWR_in with a predetermined reference voltage value Vref.

When the voltage Vin is higher than the predetermined reference voltage value Vref, the auxiliary power supply device 310 may continue to perform the operation of S320. That is, when the voltage Vin is higher than the predetermined reference voltage value Vref, the auxiliary power supply device 310 may continue to output the stored power of the first power storage unit 311 as the output power PWR_out.

When the voltage Vin is lower than the predetermined reference voltage value Vref, in an operation S340, the auxiliary power supply device 310 may output the stored power of the second power storage unit 312 as the output power PWR_out until the sudden power-off operation is completed.

According to the above-described embodiment of the present inventive concepts, the auxiliary power supply device 310 may output the stored power of the first power storage unit 311 as the output power PWR_out until the voltage Vin of the input power PWR_in is made lower than the predetermined reference voltage value Vref after a sudden power-off occurs. Then when the voltage Vin of the input power PWR_in is made lower than the predetermined reference voltage value Vref, the auxiliary power supply device 310 may output the stored power of the second power storage unit 312 as the output power PWR_out. Thus, since the power requirement conditions of a first sudden power-off operation requiring a high peak power and a second sudden power-off operation requiring a long-term power supply may be satisfied using a smaller area than that of the prior art, an auxiliary power supply device having a reduced area and a nonvolatile memory system including the same may be provided.

Figure 9:
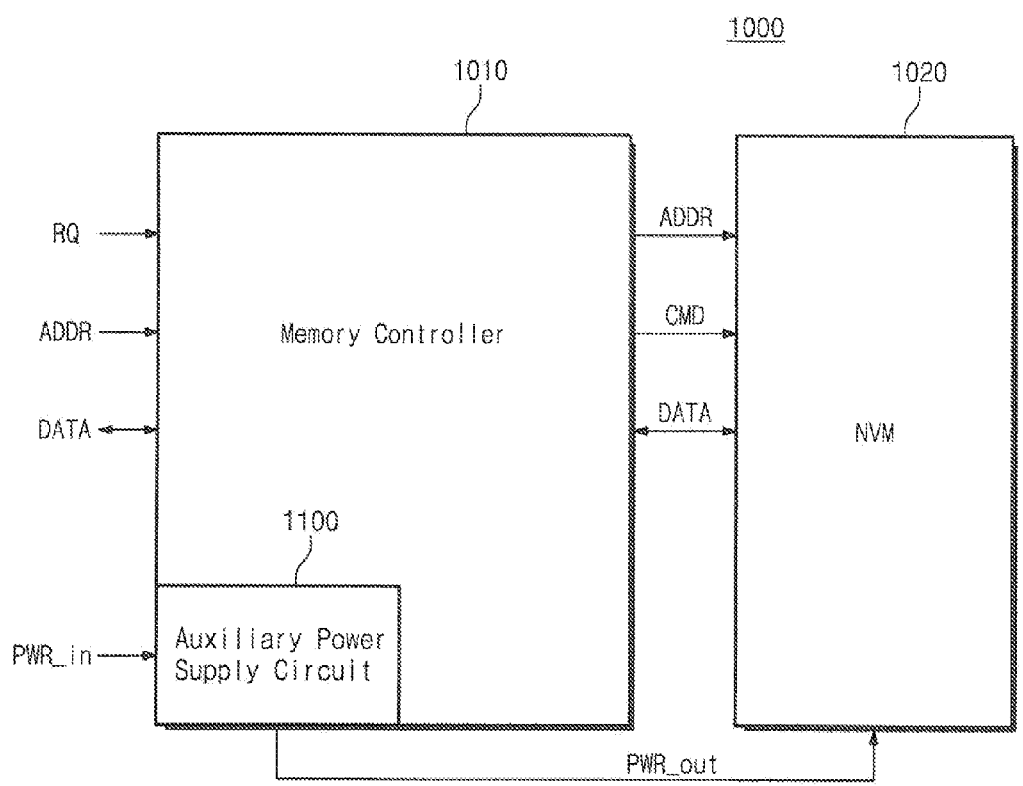
FIG. 9 is a block diagram of nonvolatile memory systems according to embodiments of the present inventive concepts.

FIG. 9 is a block diagram of a nonvolatile memory system 1000 according to embodiments of the present inventive concepts. As illustrated, the nonvolatile memory system 1000 may include a memory controller 1010 and a nonvolatile memory device 1020. The memory controller 1010 and the nonvolatile memory device 1020 have been described with reference to elements 101 and 102 in FIGS. 1 to 8, respectively, and will not be described in further detail.

The memory controller 1010 in FIG. 9 includes an auxiliary power supply device 1100. In some embodiments, the auxiliary power supply device 1100 in FIG. 9 may be identical or similar to the auxiliary power supply devices 110, 210, or 310 described with reference to FIGS. 1 to 8. While the auxiliary power supply device 110 in FIG. 1 is disposed outside a memory controller, the auxiliary power supply device 1100 in FIG. 9 may be incorporated in the memory controller 1010 and may operate based on the operating methods described with reference to FIGS. 1 to 8.

Figure 10:
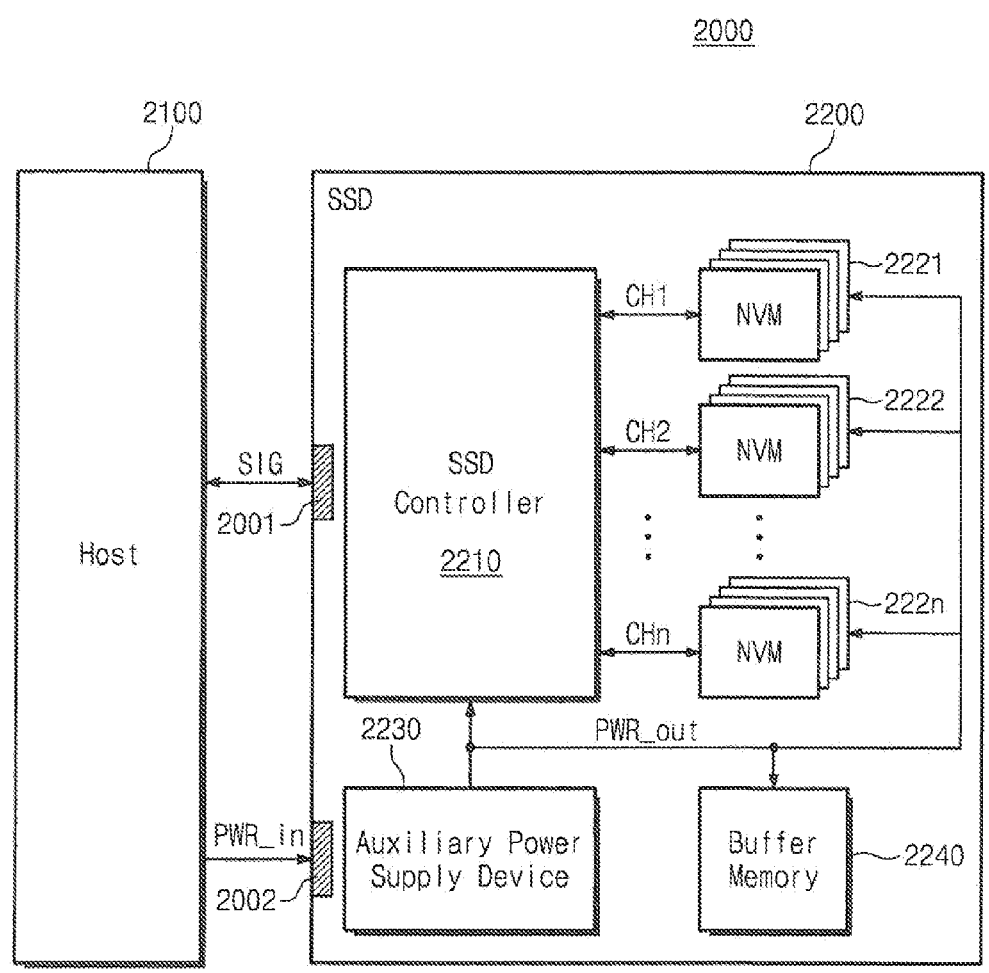
FIG. 10 is a block diagram of solid state drive (SSD) systems to which nonvolatile memory systems according to the present inventive concepts can be applied.

FIG. 10 is a block diagram of solid state drive (SSD) systems 2000 to which the nonvolatile memory system according to the present inventive concepts may be applied. As illustrated, the SSD system includes a host 2100 and an SSD 2200. The SSD 2200 transmits/receives a signal SIG to/from a host 2100 and receives input power PWR_in via a power connector 2002. The SSD 2200 includes an SSD controller 2210, a plurality of flash memories 2221 to 222n, an auxiliary power supply device 2230, and a buffer memory 2240.

The SSD controller 2210 may control the flash memories 2221 to 222n in response to the signal SIG received from the host 2100. For example, the SSD controller 2210 may control write, read, and erase operations of the nonvolatile memories 2221 to 222n in response to the signal SIG received from the host 2100.

The auxiliary power supply device 2230 is connected to the host 2100 via the power connector 2002. The auxiliary power supply device 2230 may receive the input power PWR_in from the host 2100 and may be charged. The auxiliary power supply device 2230 may supply the power of the SSD system 2000 when power is not sufficiently supplied from the host 2100. For example, when a sudden power-off occurs, the auxiliary power supply device 2230 may supply the output power PWR_out to components of the SSD 2200 based on the methods described with reference to FIGS. 1 to 9.

In some embodiments, the auxiliary power supply device 2230 may be one of the auxiliary power supply devices 110, 210, and 310 described with reference to FIGS. 1 to 9. In some embodiments, the auxiliary power supply device 2230 may be disposed inside or outside the SSD 2200. For example, the auxiliary power supply device 2230 may be disposed at a main board and may supply the output power PWR_out to the SSD 2200.

The buffer memory 2240 operates as a buffer memory of the SSD 2200. For example, the buffer memory 2240 may temporarily store data received from the host 2100 or data received from the flash memories 2221 to 222n or may temporarily store meta data (e.g., mapping table) of the flash memories 2221 to 222n. The buffer memory 2240 may include a nonvolatile memory such as DRAM, SDRAM, DDR SDRAM, LPDDR SDRAM, and SRAM or a nonvolatile memory such as FRAM ReRAM, STT-MRAM, and PRAM.

According to the embodiments of the present inventive concepts described herein, an auxiliary power supply device may include first and second power storage units. When a sudden power-off occurs, the auxiliary power supply device may output the stored power of the first power storage unit as the output power and may output the stored power of the second power storage unit as the output power after a predetermined time elapses. Thus, the auxiliary power supply device may satisfy the power requirement conditions of a first sudden power-off operation requiring high peak power when a sudden power-off occurs and the power requirement conditions of a second sudden power-off operation requiring long-term power supply after a predetermined time elapses.

A conventional auxiliary power supply device uses a large-sized power storage unit to satisfy the above-mentioned power requirement conditions, while an auxiliary power supply device according to the present inventive concepts may use different types of power storage units to have a smaller area than the conventional auxiliary power supply device.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific embodiments disclosed, and that modifications to the disclosed embodiments, as well as other embodiments, are intended to be included within the scope of the appended claims. The present inventive concepts are defined by the following claims, with equivalents of the claims to be included therein.

What is claimed is:

1. A nonvolatile memory system comprising:
   a nonvolatile memory device;
   a memory controller configured to control the nonvolatile memory device; and
   an auxiliary power supply device configured to receive an input power and supply an output power to the nonvolatile memory device and to the memory controller,
   wherein the auxiliary power supply device comprises a first power storage unit and a second power storage unit,
   wherein the auxiliary power supply device is configured to detect a sudden power-off, to initially supply stored power of the first power storage unit to the nonvolatile memory device and the memory controller as the output power when the sudden power-off is detected, and to subsequently supply stored power of the second power storage unit to the nonvolatile memory device and the memory controller as the output power after supplying the stored power of the first power storage unit, and wherein the first power storage unit is configured to supply a larger power supply amount per unit time than the second power storage unit, and the second power storage unit is configured to supply stored power for a longer time than the first power storage unit.

2. The nonvolatile memory system as set forth in claim 1, wherein the nonvolatile memory device and the memory controller are configured to use stored power provided by the auxiliary power supply device to perform a first sudden power-off operation and a second sudden power-off operation when the sudden power-off occurs.

3. The nonvolatile memory system as set forth in claim 2, wherein the first sudden power-off operation includes an operation to complete a transaction that the nonvolatile memory device is performing which is performed while the stored power of the first power storage unit is supplied.

4. The nonvolatile memory system as set forth in claim 2, wherein the second sudden power-off operation includes a backup operation of the memory controller which is performed after the first sudden power-off operation is completed.

5. The nonvolatile memory system as set forth in claim 2, wherein a first peak power required during the first sudden power-off operation is higher than a second peak power required during the second sudden power-off operation.

6. The nonvolatile memory system as set forth in claim 2, wherein a first operation time of the first sudden power-off operation is shorter than a second operation time of the second sudden power-off operation.

7. The nonvolatile memory system as set forth in claim 1, wherein the auxiliary power supply device further comprises:
a first charging circuit configured to receive the input power and charge the first power storage unit to a first charge voltage; and
a second charging circuit configured to receive the input power and charge the second power storage unit to a second charge voltage.

8. The nonvolatile memory system as set forth in claim 7, wherein the auxiliary power supply device further comprises:
a switching unit configured to supply the stored power of the first power storage unit to the nonvolatile memory device and the memory controller as the output power for a predetermined time when the sudden power-off occurs and to supply the stored power of the second power storage unit to the nonvolatile memory device and the memory controller as the output power after the predetermined time elapses.

9. The nonvolatile memory system as set forth in claim 7, wherein the auxiliary power supply device further comprises:
a switching unit configured to compare the first and second charge voltages with each other and supply the stored power of the first power storage unit or the stored power of the second power storage unit to the memory controller and the nonvolatile memory device based on a result of the comparison.

10. The nonvolatile memory system as set forth in claim 1, wherein the first power storage unit includes a tantalum capacitor and the second power storage unit includes a battery.

11. An auxiliary power supply device comprising:
a first power storage unit;
a first charging circuit configured to receive an input power and charge the first power storage unit;
a second power storage unit configured to supply a smaller power supply amount per unit time than the first power storage unit and configured to supply power for a longer time than the first power storage unit;
a second charging circuit configured to receive the input power and charge the second power storage unit; and
a switching unit configured to switch between supplying stored power of the first power storage unit to a plurality of devices and supplying stored power of the second power storage unit to the plurality of devices after a sudden power-off occurs.

12. The auxiliary power supply device as set forth in claim 11, wherein the switching unit is configured to switch between supplying the stored power of the first power storage unit to the plurality of devices for a predetermined time when the sudden power-off occurs and supplying the stored power of the second power storage unit to the plurality of devices after the predetermined time elapses.

13. The auxiliary power supply device as set forth in claim 11, wherein the first charging circuit is configured to charge the first power storage unit to a first charge voltage and the second charging circuit is configured to charge the second power storage unit to a second charge voltage lower than the first charge voltage.

14. The auxiliary power storage device as set forth in claim 11, wherein the switching unit is configured to compare a first charge voltage of the first power storage unit with a second charge voltage of the second power storage unit when the sudden power-off occurs, to supply the stored power of the first power storage unit to the plurality of devices when the first charge voltage of the first power storage unit is higher than the second charge voltage of the second power storage unit, and to supply the stored power of the second power storage unit to the plurality of devices when the first charge voltage of the first power storage unit is lower than the second charge voltage of the second power storage unit.

15. The auxiliary power supply device as set forth in claim 11, wherein the switching unit is configured to detect the sudden power-off based on a voltage of the input power.

16. The auxiliary power supply device as set forth in claim 11, wherein the switching unit is configured to receive an external trigger signal and detect the sudden power-off based on the received external trigger signal.

17. The auxiliary power supply device as set forth in claim 11, wherein the switching unit is configured to supply the stored power of the first power storage unit to the plurality of devices when the sudden power-off is detected and a voltage level of the input power is higher than a predetermined voltage level and to supply the stored power of the second power storage unit to the plurality of devices when the voltage level of the input power is lower than the predetermined voltage level.

18. The auxiliary power supply device as set forth in claim 17, wherein the predetermined voltage level is a level of a minimum voltage required for performing a first sudden power-off operation.

19. A solid state drive comprising:
a plurality of nonvolatile memory devices;

a buffer memory;

a solid state drive controller; and an auxiliary power supply device configured to receive an input power and supply an output power to the plurality of nonvolatile memory devices, the buffer memory, and the solid state drive controller, wherein the auxiliary power supply device comprises a first power storage unit and a second power storage unit, and wherein the auxiliary power supply device is configured to detect a sudden power-off, to initially supply stored power of the first power storage unit to the plurality of nonvolatile memory devices, the buffer memory, and the solid state drive controller as the output power when the sudden power-off is detected, and to subsequently supply stored power of the second power storage unit to the plurality of nonvolatile memory devices, the buffer memory, and the solid state drive controller as the output power after supplying the first stored power, and wherein the first power storage unit is configured to supply a larger power supply amount per unit time than the second power storage unit, and the second power storage unit is configured to supply stored power for a longer time than the first power storage unit.

* * * * *